United States Patent
Lin et al.

(10) Patent No.: US 10,362,684 B1
(45) Date of Patent: Jul. 23, 2019

(54) METHOD FOR IMPROVING ADHESION BETWEEN CERAMIC CARRIER AND THICK FILM CIRCUIT

(71) Applicant: National Chung-Shan Institute of Science and Technology, Taoyuan (TW)

(72) Inventors: Chia-Ting Lin, Taoyuan (TW); Jlin-Fuh Yau, Taoyuan (TW); Chung-Yen Lu, Taoyuan (TW); Yang-Kuo Kuo, Taoyuan (TW)

(73) Assignee: National Chung-Shan Institute of Science and Technology, Taoyuan (TW)

( * ) Notice: Subject to any disclaimer, the term of this patent is extended or adjusted under 35 U.S.C. 154(b) by 0 days.

(21) Appl. No.: 16/158,239

(22) Filed: Oct. 11, 2018

(51) Int. Cl.
| | |
|---|---|
| *H05K 1/00* | (2006.01) |
| *H05K 1/02* | (2006.01) |
| *H05K 1/09* | (2006.01) |
| *H05K 3/00* | (2006.01) |
| *H05K 3/02* | (2006.01) |
| *H05K 3/24* | (2006.01) |
| *B32B 18/00* | (2006.01) |
| *C04B 41/45* | (2006.01) |
| *C04B 41/51* | (2006.01) |
| *C04B 41/88* | (2006.01) |
| *H05K 3/12* | (2006.01) |
| *H05K 1/03* | (2006.01) |
| *H05K 3/34* | (2006.01) |

(52) U.S. Cl.
CPC .......... *H05K 3/1283* (2013.01); *H05K 1/021* (2013.01); *H05K 1/0306* (2013.01); *H05K 1/092* (2013.01); *H05K 3/34* (2013.01)

(58) Field of Classification Search
CPC .. H05K 1/00; H05K 1/02; H05K 1/09; H05K 1/24; H05K 3/00; H05K 3/02; H05K 3/24; B32B 18/00; B32B 18/10; B32B 18/18; C04B 41/45; C04B 41/51; C04B 41/88
USPC .......... 174/255; 156/89.12, 89.28, 246, 252; 427/126.3, 376.2, 376.6, 510, 595; 428/209, 698, 702; 430/98, 252, 314, 430/317; 29/831, 846, 852
See application file for complete search history.

(56) References Cited

U.S. PATENT DOCUMENTS

| | | | | |
|---|---|---|---|---|
| 4,238,848 A | * | 12/1980 | Yamaguchi | ............... G04G 9/06 368/276 |
| 4,959,255 A | * | 9/1990 | Suzuki | ................... C04B 41/009 428/141 |

(Continued)

*Primary Examiner* — Xiaoliang Chen
(74) *Attorney, Agent, or Firm* — Winston Hsu

(57) ABSTRACT

The present invention relates to a method for improving adhesion between ceramic and a thick film circuit. The method is particularly directed to accelerate the formation of a ceramic-metal eutectic phase between the ceramic carrier and the metal circuit by solid-phase diffusion bonding under a positive atmosphere. A metallic conductive slurry or its oxide slurry is printed on the surface of the ceramic carrier to form a circuit pattern by a thick film screen printing. The ceramic carrier is placed in an oven with temperature controlled by a program under a positive-pressure atmosphere of an inert gas including nitrogen, hydrogen or their mixtures. An eutectic phase is formed between the ceramic carrier and the metal circuit under a high temperature eutectic condition to increase the adhesion between the ceramic carrier and the thick film circuit.

11 Claims, 3 Drawing Sheets

(56) References Cited

U.S. PATENT DOCUMENTS

| | | | | |
|---|---|---|---|---|
| 4,959,507 A | * | 9/1990 | Tanaka | H01L 21/4839 174/257 |
| 4,964,923 A | * | 10/1990 | Takeuchi | C04B 41/009 148/276 |
| 5,162,191 A | * | 11/1992 | Sedberry | B41J 2/345 430/198 |
| 5,676,781 A | * | 10/1997 | Aoki | B32B 18/00 156/246 |
| 5,686,172 A | * | 11/1997 | Ohya | H01L 21/4846 156/306.3 |
| 5,849,170 A | * | 12/1998 | Djokic | C23C 18/1865 205/163 |
| 5,925,403 A | * | 7/1999 | Yoshizawa | C04B 41/5127 427/126.3 |
| 6,506,007 B1 | * | 1/2003 | Kishimoto | B23P 19/067 411/14.5 |
| 6,703,186 B1 | * | 3/2004 | Yanagimoto | H05K 3/102 427/229 |
| 2002/0040522 A1 | * | 4/2002 | Ohya | H05K 3/0011 29/846 |
| 2002/0106577 A1 | * | 8/2002 | Kubota | G03F 7/0047 430/252 |
| 2007/0138710 A1 | * | 6/2007 | Fukuyama | C04B 41/009 264/648 |
| 2008/0236874 A1 | * | 10/2008 | Khaselev | H01B 1/02 174/257 |
| 2009/0301764 A1 | * | 12/2009 | Kawamura | B24B 1/04 174/250 |
| 2011/0045209 A1 | * | 2/2011 | Seleznev | C04B 37/026 427/597 |

\* cited by examiner

METHOD FOR IMPROVING ADHESION BETWEEN CERAMIC CARRIER AND THICK FILM CIRCUIT

BACKGROUND OF THE INVENTION

1. Field of the Invention

The present invention generally relates to a method for improving the adhesion between a ceramic carrier and a metal thick film circuit. In particular, the present invention is directed to the formation of a ceramic-metal eutectic phase which is generated by a solid-phase diffusion bonding under a high temperature eutectic condition and a positive atmosphere in order to increase the adhesion between the ceramic carrier and the metal thick film circuit.

2. Description of the Prior Art

A ceramic heat-dissipating carrier has been widely used in the electronic-related fields, such as various LEDs and power modules. A thick film technique is able to print a circuit on various carriers by screen printing and to further fix the circuit on the surface of the ceramic carrier by LTCC (low temperature co-fired multilayer ceramics) or HTCC (high temperature co-fired multilayer ceramics). With respect to direct bonded copper, it basically generates a copper oxide eutectic phase of a copper metal circuit and of a ceramic substrate under an atmosphere and eutectic temperature to tightly bond the two together to increase the adhesion of the circuit.

At present, the bonding of a ceramic heat-dissipating substrate and a circuit includes methods such as DBC, DPC (direct plated copper), LTCC and HTCC . . . etc. to carry out a metallization process. Although the DBC process has advantages such as high mechanical strength, it however still needs to use expensive techniques such as lithography and etching to remove excess copper films which cover the surface, and so does DPC. It also has process limits to make the thickness of a circuit unable to be greater than 150 μm so it is restricted to be applied to high power applications. Due to physical condition limits, LTCC and HTCC are only applicable to the combination of a copper circuit and an aluminum oxide carrier. If aluminum nitride with greater coefficient of thermal conductivity is used, it is instead not easy to form a circuit pattern because of its sintering temperature much higher than the melting point of metallic copper.

In order to increase the adhesion between the circuit and the carrier, conventional circuits which are manufactured by screen printing need an interlayer to compensate the too great coefficient differences of the thermal expansion to further increase the circuit strength. However, because of the interlayer as well, some procedures such as etching or lithography still must be taken into consideration for the manufacturing process.

Therefore, the related technical fields still need a method for efficiently improving the adhesion between a ceramic carrier and a metal circuit, and for reducing the cost of time and the cost of process.

The object of the present invention is to provide a method for the combination of a thick film screen printing and a ceramic-metal eutectic phase process, which includes a method to increase the adhesion.

SUMMARY OF THE INVENTION

In view of the above shortcomings of prior art, the present invention accordingly proposes a method for improving the adhesion between a metal circuit and a ceramic carrier, and to reduce the cost of time and the cost of process by the formation of a ceramic-metal eutectic layer.

In order to achieve the above object, a solution according to the present invention is proposed to have a method for improving the adhesion between a metallic copper circuit and a ceramic carrier. In a first embodiment of the present invention, the method includes: providing a ceramic carrier, and on the surface of the ceramic carrier disposed a metallic copper oxide layer circuit pattern which is generated by a thick film screen printing technique; drying the surface in an oven to remove an excess solvent in the metallic copper oxide layer; subjecting the ceramic carrier to an atmosphere in a high temperature furnace with a downward pressure of 40 kgf/cm$^2$ or less which is vertical to the carrier; and setting the temperature of the high temperature furnace within 10° C. of the eutectic temperature of metallic copper and the ceramic carrier so as to form a metallic copper-ceramic eutectic layer which is disposed between the ceramic carrier and the metallic copper.

In the above, the method is able to generate a metallic copper-ceramic eutectic layer which is disposed between the ceramic carrier and the metallic copper to increase the adhesion between the metallic copper and the ceramic carrier by means of the eutectic layer. The stripping of the metallic copper circuit from the ceramic carrier which is caused by the difference of thermal expansion or by an external force may be avoided. In addition, the vertical pressure to the direction of the carrier is able to enhance the efficiency of the solid-phase diffusion bonding and to further facilitate the formation of the metallic copper-ceramic eutectic layer.

The method of the present invention includes at least the following steps:

(A) providing a carrier of a ceramic material;

(B) cleaning the ceramic carrier and subjecting the ceramic carrier to a polishing and grinding process to make the ceramic carrier flat and smooth;

(C) using metallic copper or metallic copper oxide to print a circuit pattern on the surface of the ceramic carrier by a screen printing technique so that the circuit pattern is tightly attached to the surface of the ceramic carrier;

(D) placing the ceramic carrier in an oven to dry the ceramic carrier under a temperature less than 105° C.;

(E) subjecting the ceramic carrier to an atmosphere in a high temperature furnace and simultaneously applying a downward pressure of 40 kgf/cm$^2$ or less which is vertical to the carrier;

(F) setting the high temperature furnace in a temperature range which is within 10° C. of the eutectic temperature of metallic copper and the ceramic carrier so as to form a metallic copper-ceramic eutectic layer which is disposed between the ceramic carrier and the metallic copper.

These and other objectives of the present invention will no doubt become obvious to those of ordinary skill in the art after reading the following detailed description of the preferred embodiment that is illustrated in the various figures and drawings.

DETAILED DESCRIPTION

The embodiments of the present invention are described by the following specific examples. Those skilled in the art can readily understand the advantages and effects of the present invention from the disclosure of the present disclosure.

The current metallized circuit on a ceramic carrier technique is labor-intensive, time-consuming and cost-consuming because it usually uses semiconductor procedures such as lithography and etching . . . etc. The traditional use of the thick film technique such as screen printing has compatibility problems because many needed materials have distinct features so composite materials or processes are required instead of single process or technique. The invention develops a novel method for improving the adhesion between a ceramic carrier and a thick film circuit, in which a metallic copper-ceramic eutectic layer is generated at the interface by an eutectic high temperature condition between the ceramic carrier and the metallic copper. At the same time, a positive pressure which is perpendicular to the surface of the carrier is used to enhance the efficiency for the formation of the metallic copper-ceramic eutectic layer. The present invention is able to realize the improvement of the adhesion of the metal circuit on the ceramic carrier by a superior technology of one single process, without the need of additional materials or procedures, and in such a way it can solve the problem of the cost when the thin film process is applied to the ceramic carrier metallization process, and the problem of aluminum nitride unable to be sintered with metallic copper.

Figure 1:
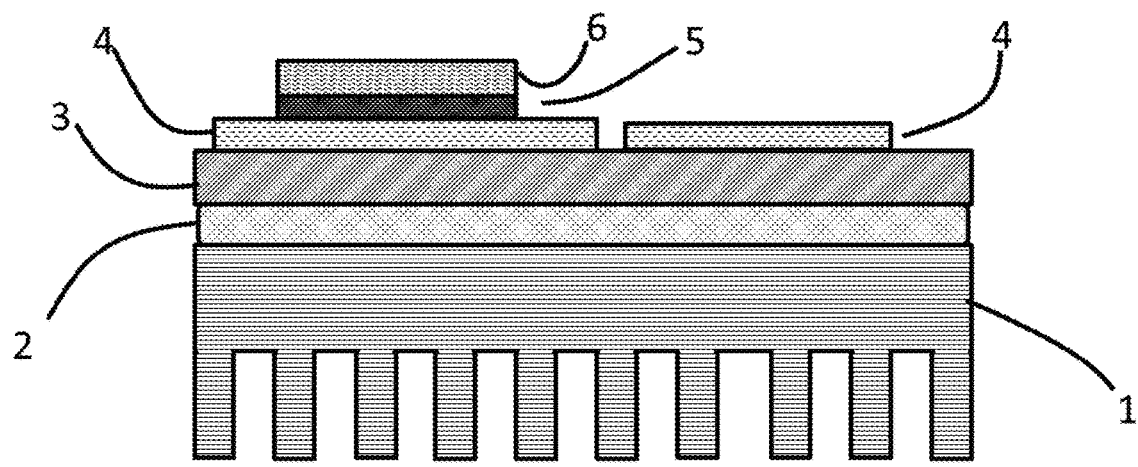
FIG. 1 illustrates a simplified cross-sectional prospective view of an element in accordance with the first embodiment of the present invention.
Figure 2:
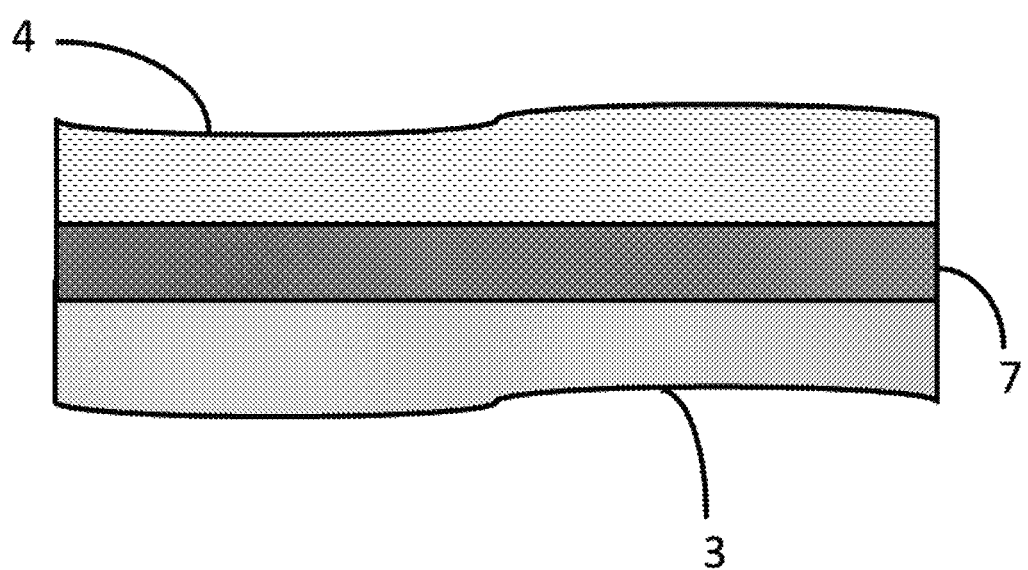
FIG. 2 illustrates an enlarged view of the bonding region of metallic copper and the ceramic carrier in FIG. 1.

Please refer to FIG. 1 and FIG. 2; they illustrate a cross-sectional view of an element in accordance with an embodiment of the present invention.

Please refer to FIG. 1, a semiconductor element 6 is fixed on a metal circuit 4 with the help of a solder layer 5, and the metal circuit 4 is fixed to a ceramic carrier 3 by the method for improving the adhesion between the ceramic carrier and the thick film circuit of the present invention. The ceramic carrier 3 is attached to the back plate of a fin-type heat sink 1 with the help of a thermally conductive gel 2.

Please refer to FIG. 2. A solid phase diffusion bonding process is carried out by the application of a vertical pressure of 40 kgf/cm$^2$ or less to the ceramic carrier 3 and in a high temperature furnace under a temperature which is set at the eutectic temperature of metallic copper and the ceramic carrier to finish the formation of the metallic copper-ceramic eutectic layer 7, and to further enhance the adhesion between the thick film circuit 4 and the ceramic carrier 3.

Please refer to FIG. 2. The ceramic carrier which is applicable to this method includes an oxygen-free ceramic carrier, such as aluminum nitride (AlN), silicon nitride (Si$_3$N$_4$) and silicon carbide (SiC), or an oxygen-containing ceramic carrier, such as aluminum oxide (Al$_2$O$_3$) or silicon oxynitride (SiON).

Figure 3:
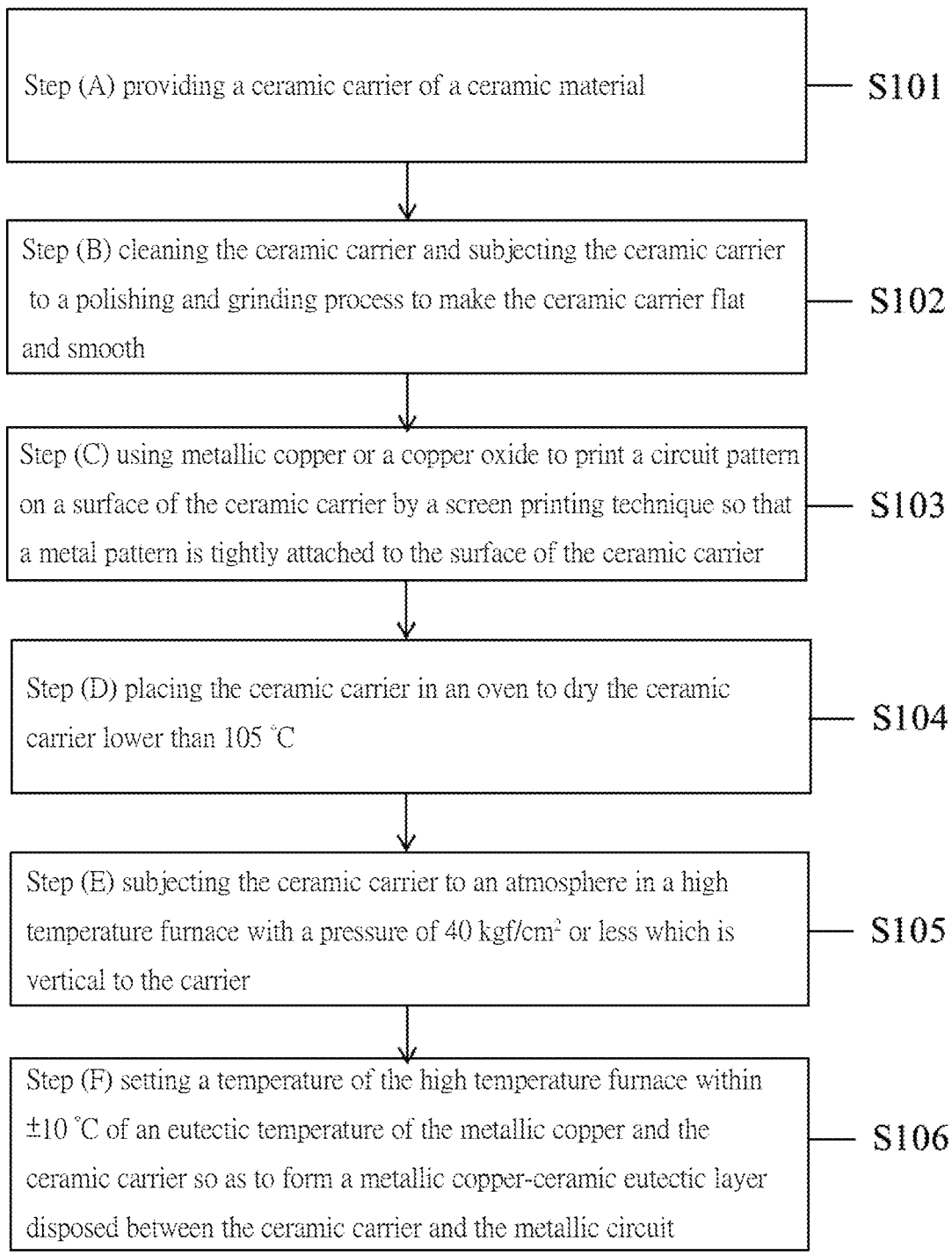
FIG. 3 illustrates a flow chart of the method for improving the adhesion of a thick film circuit to a ceramic carrier.

Please refer to FIG. 3. FIG. 3 illustrates a flow chart of the method for improving the adhesion between a ceramic carrier and a thick film circuit. As shown, the method for improving the adhesion between a ceramic carrier and a thick film circuit of the present invention includes the steps:
(A) providing a ceramic carrier 3 of a ceramic material;
(B) cleaning the ceramic carrier 3 and subjecting the ceramic carrier 3 to a polishing and grinding process to make the ceramic carrier 3 flat and smooth;
(C) using metallic copper or a copper oxide to print a circuit pattern onto the surface of the ceramic carrier 3 by a screen printing technique so that a metal circuit 4 with the circuit pattern is tightly attached to the surface of the ceramic carrier 3;
(D) placing the ceramic carrier 3 in an oven to dry the ceramic carrier 3 under a temperature less than 105° C.;
(E) subjecting the ceramic carrier 3 to an atmosphere or to an inert gas atmosphere in a high temperature furnace with the application of a pressure of 40 kgf/cm$^2$ or less which is vertical to the ceramic carrier 3. The circuit pattern may have a thickness of 2 μm to 100 μm.

If the ceramic carrier used in the method is an oxygen-free ceramic carrier, for example, aluminum nitride (AlN), the ceramic carrier 3 may be subjected to an atmosphere to which a trace amount of oxygen is added, for example, 1% to 2% of O$_2$, and to a temperature which is set to make the oxidation reaction of the ceramic carrier possible, for example, 400° C.±10° C., to oxidize the oxygen-free ceramic carrier so that the phase interface of the ceramic carrier 3 is oxidized to produce an oxide by the trace amount of oxygen. After the oxidation reaction is completed, the original atmosphere is then purged to become a nitrogen atmosphere, a nitrogen atmosphere containing 10% or less of hydrogen, or another nitrogen atmosphere containing 30% or less of ammonia.

And further (F) setting the temperature of the high temperature furnace to be 1065° C.±10° C. of the high temperature eutectic temperature of the metallic copper and the ceramic carrier 3 so that a metallic copper-ceramic eutectic layer 7 is formed between the ceramic carrier 3 and the metal circuit 4; and
(G) after cooling off, the obtained ceramic carrier 3 has the metallic copper-ceramic eutectic layer 7 to improve the adhesion to the metal circuit 4. The thickness of the obtained metallic copper-ceramic eutectic layer 7 may be 2 μm to 20 μm.

Given the above, to combine the traditional screen printed circuit with an eutectic layer process technique, to go with the positive pressure high temperature process, to simultaneously carry out the reduction of the metal oxide circuit and the formation of the eutectic layer by sandwich-interlayer pressure method to firmly attach the resultant metal circuit to the ceramic carrier so as to solve the problems of time-wasting and cost-wasting and at the same time to avoid the use of ceramics with low thermal conductivity. In addition, the improvement of the circuit metallization process of the conventional screen printing ceramic substrate is able to simplify the two-step conventional high temperature process to become just one single process so as to reduce the cost of time and to overcome problems such as circuit peeling. Moreover, the use of a ceramic material with high thermal conductivity is able to rapidly dissipate the heat which is generated by components so as to lower the working temperature and to increase the service life of products.

The ceramic carrier 3 in this embodiment may be an aluminum-type ceramic carrier. Taking aluminum nitride as an example, after the aluminum nitride ceramic carrier 3 undergoes the polishing and grinding process in the step (B) of the embodiment, the surface evenness or surface roughness are adjusted according to different requirements so that the total thickness variation (TTV) is less than 100 μm. The metallic copper or the metallic copper oxide which in the step (C) of the embodiment may be in a form of a slurry or of a gel is well mixed with a polymeric material. The metallic copper or the metallic copper oxide accounts for 90% or more of the total weight. The drying temperature in the step (D) of the embodiment is set to be 105° C. or less to carryout the vaporization of the polymeric material in the slurry of the metallic copper or of the metallic copper oxide so that the metallic copper or the metallic copper oxide is able to be completely attached to the ceramic carrier 3. The ceramic carrier 3 in the step (E) of the embodiment is placed in a high temperature furnace under an atmosphere. The atmosphere may be nitrogen gas, nitrogen gas containing hydrogen gas which is 10% or less, or nitrogen gas containing ammonia gas which is 30% or less. The pressure applied in the step (E) of the embodiment may be a positive force perpendicular to the direction of the carrier, or the internal gas pressure in the high temperature furnace may be increased up to 40 kgf/cm$^2$. The temperature of the high temperature furnace in step (F) of the embodiment is set to be within 1065° C.±10° C. of the high temperature eutectic temperature of the metallic copper and the ceramic carrier 3. The ceramic carrier material for use in the embodiment is an aluminum nitride ceramic, and the eutectic temperature of the aluminum-type ceramic and the metallic copper is 1065° C. so the high temperature eutectic temperature of the high temperature furnace is set to be within 1065° C.±10° C. so as to obtain a metallic copper-ceramic eutectic layer 7 (AlN—Al$_2$O$_3$—Cu) which is formed between the aluminum-type ceramic carrier 3 and the metallic copper. After the steps of the embodiment are completed, a metallized ceramic carrier with high adhesion is resultantly obtained.

In summary, the present invention prints a metal or a metal oxide onto a ceramic carrier to carry out a high-temperature reduction of the metal oxide. A robust eutectic phase interface is formed under the ceramic-metal eutectic temperature, and by going with an applied positive force at the same time to complete the metallized ceramic carrier process and to strengthen the adhesion of the resultant circuit. Consequently, the process is simplified and the labor-cost and equipment-cost are lowered and simultaneously the heat transfer efficiency is improved so that the waste heat of high-power modules or of 3C components can be quickly dissipated so as to extend the service life of the components and to increase reliability. In addition, the present invention suggests that the proposal of the metal-ceramic eutectic theory may go with a positively-directed pressure to generate a strong and robust eutectic interface under the metal-ceramic eutectic temperature (with a small amount of O$_2$ added) to overcome process problems such as the differences in thermal expansion coefficients. Besides, compared with the process techniques such as DBC or DPC which involves procedures such as lithography, the method of the present invention is capable of greatly reducing the equipment-cost and labor-cost. Moreover, due to the lower process temperature (1065° C.±10° C., namely 1055° C.~1075° C.), aluminum nitride ceramic materials of high thermal conductivity may serve as the carriers (but LCTT and HTCC require the use of aluminum oxide).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for improving an adhesion between a ceramic carrier and a thick film circuit, comprising at least following steps:

(A) providing a ceramic carrier of a ceramic material;
   (B) cleaning the ceramic carrier and subjecting the ceramic carrier to a polishing and grinding process to make the ceramic carrier flat and smooth;
   (C) using metallic copper or a metallic copper oxide to print a circuit pattern on a surface of the ceramic carrier by a screen printing technique so that a metal pattern is tightly attached to the surface of the ceramic carrier;
   (D) placing the ceramic carrier in an oven to dry the ceramic carrier lower than 105° C.;
   (E) subjecting the ceramic carrier to an atmosphere in a high temperature furnace with a pressure of 40 kgf/cm$^2$ or less which is vertical to the carrier;
   (F) setting a temperature of the high temperature furnace within ±10° C. of an eutectic temperature of the metallic copper and the ceramic carrier so as to form a metallic copper-ceramic eutectic layer which is disposed between the ceramic carrier and a metal circuit; and
   (G) obtaining the ceramic carrier to improve the adhesion with respect to the metal circuit by the metallic copper-ceramic eutectic layer after cooling off.

2. The method for improving an adhesion between a ceramic carrier and a thick film circuit of claim 1, wherein the ceramic carrier comprises aluminum nitride (AlN), aluminum oxide (Al$_2$O$_3$), silicon nitride (Si$_3$N$_4$), silicon carbide (SiC) or silicon oxynitride (SiON).

3. The method for improving an adhesion between a ceramic carrier and a thick film circuit of claim 1, wherein a total thickness variation (TTV) of the ceramic carrier is less than 100 μm after the polishing and grinding process; a surface evenness and a surface roughness are adjusted according to different requirements.

4. The method for improving an adhesion between a ceramic carrier and a thick film circuit of claim 1, wherein the metallic copper or the metallic copper oxide which is in a form of a slurry or of a gel is well mixed with a polymeric material, and the metallic copper or the metallic copper oxide accounts for 90% or more of a total weight.

5. The method for improving an adhesion between a ceramic carrier and a thick film circuit of claim 4, wherein vaporization of the polymeric material in the slurry or in the gel is carried out in the step (D) so that the metal circuit is completely attached to the ceramic carrier.

6. The method for improving an adhesion between a ceramic carrier and a thick film circuit of claim 1, wherein the atmosphere is nitrogen gas, nitrogen gas containing 10% or less hydrogen gas, or nitrogen gas containing 30% or less ammonia gas.

7. The method for improving an adhesion between a ceramic carrier and a thick film circuit of claim 1, wherein the pressure applied in the high temperature furnace is a positive force which is perpendicular to the carrier, or an internal gas pressure in the high temperature furnace is increased up to 40 kgf/cm$^2$.

8. The method for improving an adhesion between a ceramic carrier and a thick film circuit of claim 1, wherein the ceramic carrier is an aluminum-type ceramic carrier, and the temperature of the high temperature furnace is set to be within ±10° C. of the high temperature eutectic temperature 1065° C. of the metallic copper and the aluminum-type ceramic carrier.

9. The method for improving an adhesion between a ceramic carrier and a thick film circuit of claim 8, wherein the metallic copper-ceramic eutectic layer is AlN—Al$_2$O$_3$—Cu.

10. The method for improving an adhesion between a ceramic carrier and a thick film circuit of claim 1, wherein a thickness of the metallic copper-ceramic eutectic layer is 2 μm to 20 μm.

11. The method for improving an adhesion between a ceramic carrier and a thick film circuit of claim 2, wherein subjecting the ceramic carrier to the atmosphere when the ceramic carrier comprises aluminum nitride (AlN), silicon nitride ($Si_3N_4$) or silicon carbide (SiC) further comprises:

- making an oxidation reaction of the ceramic carrier possible by adding 1% to 2% of $O_2$ and under a temperature which is sufficient for the oxidation reaction;
- purging the atmosphere; and
- changing the atmosphere to a nitrogen atmosphere, a nitrogen atmosphere containing 10% or less of hydrogen, or a nitrogen atmosphere containing 30% or less of ammonia.

* * * * *